(12) United States Patent
Weidner et al.

(10) Patent No.: US 8,901,592 B2
(45) Date of Patent: Dec. 2, 2014

(54) OPTOELECTRONIC COMPONENT AND METHOD FOR PRODUCING IT

(75) Inventors: Karl Weidner, Munich (DE); Johann Ramchen, Altdorf (DE); Axel Kaltenbacher, Mintraching (DE); Walter Wegleiter, Nittendorf (DE); Bernd Barchmann, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 63 days.

(21) Appl. No.: 13/822,367

(22) PCT Filed: Aug. 22, 2011

(86) PCT No.: PCT/EP2011/064377
§ 371 (c)(1),
(2), (4) Date: May 8, 2013

(87) PCT Pub. No.: WO2012/034826
PCT Pub. Date: Mar. 22, 2012

(65) Prior Publication Data
US 2013/0307004 A1    Nov. 21, 2013

(30) Foreign Application Priority Data

Sep. 15, 2010    (DE) .................. 10 2010 045 403

(51) Int. Cl.
| | |
|---|---|
| H01L 33/62 | (2010.01) |
| H01L 33/60 | (2010.01) |
| H01L 23/00 | (2006.01) |
| H01L 23/055 | (2006.01) |
| H01L 33/50 | (2010.01) |
| H01L 33/54 | (2010.01) |

(52) U.S. Cl.
CPC ............ *H01L 33/60* (2013.01); *H01L 33/62* (2013.01); *H01L 24/18* (2013.01); *H01L 23/055* (2013.01); *H01L 33/505* (2013.01); *H01L 33/54* (2013.01)
USPC .......................................... 257/98

(58) Field of Classification Search
USPC ................. 438/106; 257/98, 99, 100
See application file for complete search history.

(56) References Cited

U.S. PATENT DOCUMENTS

| | | | |
|---|---|---|---|
| 6,531,328 B1 * | 3/2003 | Chen ............................... | 438/26 |
| 7,329,905 B2 * | 2/2008 | Ibbetson et al. ................. | 257/98 |
| 8,227,821 B2 * | 7/2012 | Bogner et al. .................. | 257/98 |

(Continued)

FOREIGN PATENT DOCUMENTS

| | | |
|---|---|---|
| DE | 102 45 946 C1 | 10/2003 |
| DE | 10 2004 021 233 A1 | 12/2005 |

(Continued)

*Primary Examiner* — Thao P Le
(74) *Attorney, Agent, or Firm* — DLA Piper LLP (US)

(57) ABSTRACT

An optoelectronic component includes a carrier having a first connection region and a second connection region, a radiation-emitting semiconductor chip having a base surface and a radiation exit surface opposite the base surface, wherein the semiconductor chip is arranged by the base surface on the carrier, a housing having a lower housing part arranged on the carrier and adjoining side flanks of the semiconductor chip, and an upper housing part arranged on the lower housing part and shaped as a reflector for radiation emitted by the semiconductor chip, and an electrical connection layer which leads from the radiation exit surface of the semiconductor chip via a part of the interface between the lower and the upper housing part and through the lower housing part to the first connection region on the carrier.

16 Claims, 4 Drawing Sheets

(56) References Cited

U.S. PATENT DOCUMENTS

| | | |
|---|---|---|
| 2002/0176468 A1 | 11/2002 | Kaneko |
| 2003/0057421 A1 | 3/2003 | Chen |
| 2004/0251469 A1* | 12/2004 | Yatsuda et al. ............... 257/100 |
| 2005/0242362 A1* | 11/2005 | Shimizu et al. ............... 257/99 |
| 2006/0006404 A1 | 1/2006 | Ibbetson et al. |
| 2006/0198162 A1 | 9/2006 | Ishidu et al. |
| 2007/0228386 A1 | 10/2007 | Shie et al. |
| 2009/0032829 A1 | 2/2009 | Chew et al. |

FOREIGN PATENT DOCUMENTS

| | | |
|---|---|---|
| DE | 10 2008 035 708 A1 | 2/2009 |
| WO | 97/50132 A1 | 12/1997 |
| WO | 00/65664 A1 | 11/2000 |

* cited by examiner

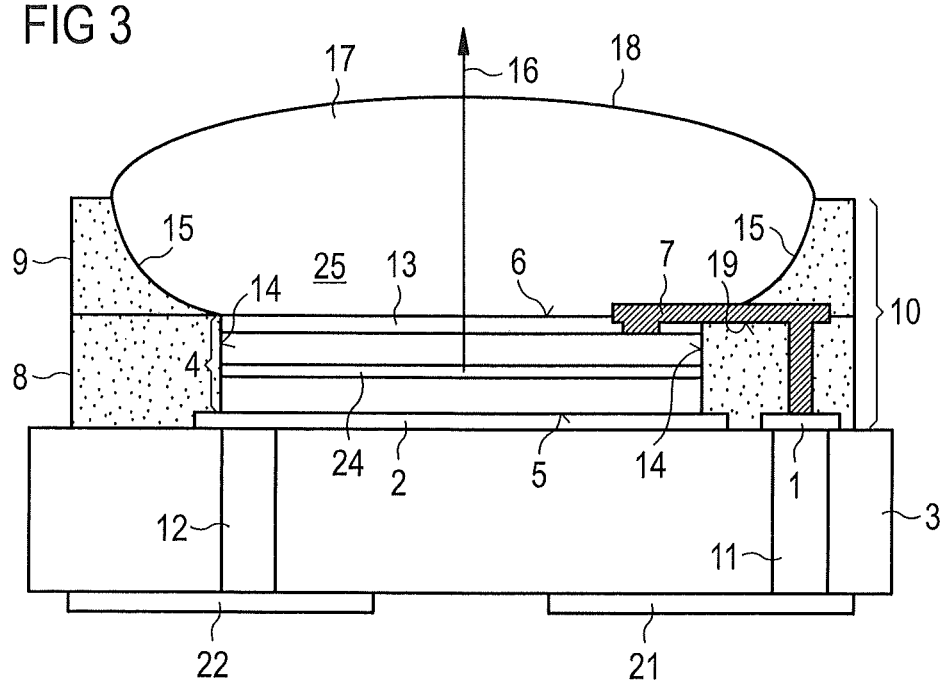

OPTOELECTRONIC COMPONENT AND METHOD FOR PRODUCING IT

RELATED APPLICATIONS

This application is a §371 of International Application No. PCT/EP2011/064377, with an international filing date of Aug. 22, 2011 (WO 2012/034826 A1, published Mar. 22, 2012), which is based on German Patent Application No. 10 2010 045 403.6, filed Sep. 15, 2010, the subject matter of which is incorporated herein by reference.

TECHNICAL FIELD

This disclosure relates to an optoelectronic component and a method for producing it.

BACKGROUND

WO 00/65664 discloses an optoelectronic component wherein a radiation-emitting semiconductor chip is mounted at its base surface onto a connection region of a carrier and has a connection contact at the opposite radiation exit surface, the connection contact connected to a further connection region of the carrier by a bonding wire. The semiconductor chip and the bonding wire are arranged in a cutout of a housing, wherein the reflective side walls of the housing form a reflector for the radiation emitted by the semiconductor chip. The semiconductor chip and the bonding wire are embedded into a transparent potting material comprising a luminescence conversion substance for the wavelength conversion of the radiation emitted by the semiconductor chip. A lens is furthermore adhesively bonded onto the transparent potting material, the lens serving for the beam shaping of the emitted radiation.

It could nonetheless be helpful to provide an optoelectronic component distinguished by a more compact design, an improved radiation efficiency and a comparatively simple production method.

SUMMARY

We provide an optoelectronic component including a carrier having a first connection region and a second connection region, a radiation-emitting semiconductor chip having a base surface and a radiation exit surface opposite the base surface, wherein the semiconductor chip is arranged by the base surface on the carrier, a housing having a lower housing part arranged on the carrier and adjoining side flanks of the semiconductor chip, and an upper housing part arranged on the lower housing part and shaped as a reflector for radiation emitted by the semiconductor chip, and an electrical connection layer which leads from the radiation exit surface of the semiconductor chip via a part of the interface between the lower and the upper housing part and through the lower housing part to the first connection region on the carrier.

We also provide an optoelectronic component including a carrier having a first connection region and a second connection region, a radiation-emitting semiconductor chip having a base surface and a radiation exit surface, opposite the base surface, wherein the semiconductor chip is arranged by the base surface on the carrier, a housing having a lower housing part arranged on the carrier and adjoining side flanks of the semiconductor chip, and an upper housing part arranged on the lower housing part and shaped as a reflector for the radiation emitted by the semiconductor chip, and an electrical connection layer which leads from the radiation exit surface of the semiconductor chip via a part of the interface between the lower and the upper housing part and through the lower housing part to the first connection region on the carrier, wherein the lower and/or the upper housing part include(s) a basic material into which are embedded particles that increase reflection of the basic material, and the lower and the upper housing part include the same basic material.

BRIEF DESCRIPTION OF THE DRAWINGS

FIG. 3 shows a schematic illustration of a cross section through an optoelectronic component in accordance with a third example.

DETAILED DESCRIPTION

Figure 1:
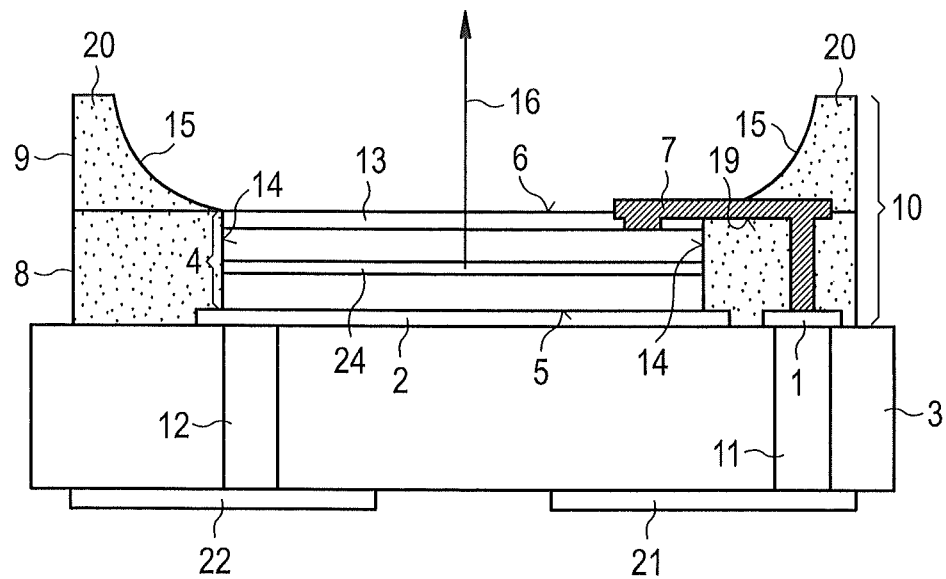
FIG. 1 shows a schematic illustration of a cross section through an optoelectronic component in accordance with a first example.

Our optoelectronic component may comprise a carrier having a first connection region and a second connection region. Furthermore, the optoelectronic component may comprise a radiation-emitting semiconductor chip having a base surface and a radiation exit surface, opposite the base surface, wherein the semiconductor chip is arranged by the base surface on the carrier.

Furthermore, the optoelectronic component advantageously contains a housing having a lower housing part arranged on the carrier and adjoining side flanks of the semiconductor chip, and an upper housing part arranged on the lower housing part and forming a reflector for radiation emitted by the semiconductor chip.

An electrical connection layer is led from the radiation exit surface of the semiconductor chip via a part of the interface between the lower and the upper housing part and through the lower housing part to the first connection region on the carrier.

The optoelectronic component configured in this way is distinguished, in particular, by a compact design. In particular, the lower housing part directly adjoins the side flanks of the semiconductor chip. This is made possible, in particular, by virtue of the fact that, in contrast to conventional practice, contact is not made with the semiconductor chip by a bonding wire led from the radiation exit surface of the semiconductor chip to a connection region on the carrier. Instead, contact is advantageously made with the semiconductor chip such that an electrical connection layer is led away from the radiation exit surface of the semiconductor chip via an interface of the lower housing part which adjoins the side flanks of the semiconductor chip in a lateral direction from the semiconductor chip. At a distance from the semiconductor chip, the connection layer then runs through the lower housing part as far as the first connection region on the carrier. Therefore, contact is made with the radiation-emitting semiconductor chip in a wire-free manner, in particular.

A second connection contact of the semiconductor chip can be realized, in particular, by virtue of the fact that the semiconductor chip is mounted at the base surface onto the second connection region of the carrier.

Preferably, the lower and/or the upper housing part comprise(s) a basic material into which are embedded particles that increase the reflection of the basic material.

The basic material of the lower and/or of the upper housing part is preferably a silicone. In particular, the lower and the upper housing part can comprise the same basic material, for example, a silicone.

The particles are preferably $TiO_2$ particles. As a result of the $TiO_2$ particles being embedded into the basic material of the lower and/or upper housing part, the reflection of the basic material is advantageously increased compared to a housing material without the embedded $TiO_2$ particles since $TiO_2$ has a comparatively high refractive index, in particular, a higher refractive index than silicone. Furthermore, radiation is scattered at the particles such that, given a sufficiently large proportion by weight of the particles in the material of the lower and/or upper housing part, a significant proportion of the radiation is backscattered in the direction of incidence.

The proportion by weight of the particles in the lower and/or upper housing part is preferably 5% to 50%. It has been found that, at such a concentration of the reflection-increasing particles, in particular $TiO_2$ particles, an increase in the reflection can be observed.

The reflection of the housing material increased by the embedded particles has the advantage in the case of the lower housing part of preventing undesired coupling-out of radiation from the semiconductor chip in a lateral direction through the reflective housing material of the lower housing part adjoining the side flanks of the semiconductor chip. Radiation emitted by the semiconductor chip in a lateral direction is therefore reflected back from the lower housing part at least partly into the semiconductor chip such that this proportion of radiation is deflected in particular after one or more further reflections within the semiconductor chip to the radiation exit surface of the semiconductor chip.

In the case of the upper housing part, the reflection increased by the particles embedded into the basic material is advantageous since the upper housing part forms a reflector for the radiation emitted by the semiconductor chip.

Preferably, the reflector adjoins the radiation exit surface of the semiconductor chip at least in regions. This can be realized, in particular, such that the lower housing part has a height such that it is adjacent to a radiation exit surface of the semiconductor chip in a flush manner. The base surface of the upper housing part, which forms the reflector, is therefore advantageously arranged at the level of the radiation exit surface of the semiconductor chip. It has been found that good beam shaping of the radiation emitted by the semiconductor chip is obtained in this way.

In one configuration, the semiconductor chip has a luminescence conversion layer at its radiation exit surface. At least part of the radiation emitted by the radiation-emitting semiconductor chip is converted toward higher wavelengths with the luminescence conversion layer. In this way, by way of example, mixed-colored or white light can be generated by a radiation-emitting semiconductor chip whose active zone emits ultraviolet or blue light. In particular, with the luminescence conversion layer, blue light can be converted into light having a longer wavelength, in particular into light having a complementary color such as yellow, for example, such that the blue light emitted by the active zone is superimposed with the proportion converted to the complementary color to form white light. The luminescence conversion layer can comprise a matrix material into which the luminescence conversion substance is embedded. The matrix material can be a polymer such as, for example, silicone or a ceramic. Suitable luminescence conversion substances are known from WO 97/50132, for example, the subject matter of which is incorporated herein by reference.

Preferably, the luminescence conversion layer does not project beyond the semiconductor layer sequence of the semiconductor chip in a lateral direction. The luminescence conversion layer advantageously has the same basic area as the semiconductor layer sequence of the semiconductor chip and is thus advantageously arranged on the semiconductor layer sequence of the semiconductor chip in a flush manner.

Preferably, the luminescence conversion layer is a prefabricated lamina adhesively bonded, for example, onto the semiconductor layer sequence.

Advantageously, a surface of the luminescence conversion layer is arranged at the same level as the interface between the lower and the upper housing part, and a part of the electrically conductive layer is arranged on a part of the surface of the luminescence conversion layer. A part of the interface between the lower and the upper housing part and a part of the luminescence conversion layer therefore advantageously function as a carrier for the electrically conductive layer.

Preferably, a cutout in the upper housing part, through which cutout the reflector is shaped in the upper housing part, is filled with a transparent potting material. The transparent potting material constitutes, in particular, a protection of the semiconductor chip against moisture and/or mechanical damage.

Advantageously, the transparent potting material has a planar surface. The transparent potting material can, in particular, terminate flush with a top side of the upper housing part and thus planarize the upper housing part.

Alternatively, the transparent potting material is shaped as a lens. That is to say that that surface of the transparent potting material facing away from the semiconductor chip is curved, for example, convexly curved. Beam shaping of the radiation emitted by the semiconductor chip can advantageously be obtained by the lens. In this way, a beam shaping element is advantageously integrated into the housing.

Preferably, the carrier has a first electrical rear-side contact and a second electrical rear-side contact at a rear side facing away from the semiconductor chip. In this case, the first electrical rear-side contact electrically conductively connects to the first connection region and the second electrical rear-side contact electrically conductively connects to the second connection region on that side of the carrier facing the semiconductor chip. What is advantageously achieved in this way is that contact can be made with the optoelectronic component from the rear side of the carrier. The optoelectronic component is therefore preferably a surface-mountable component which can be soldered onto a circuit board, for example, at the electrical rear-side contacts of the carrier.

The first electrical rear-side contact preferably electrically conductively connects to the first connection region by at least one first plated-through hole running through the carrier. Correspondingly, the second electrical rear-side contact electrically conductively connects to the second connection region by at least one second plated-through hole running through the carrier. Connection of the connection regions on that side of the carrier facing the semiconductor chip to the rear-side contacts by plated-through holes has the advantage that the optoelectronic component is more compact than if, for example, the connections between the connection regions on the front side and the rear side of the carrier were realized by connection layers led via the side surfaces of the carrier. In particular, the side flanks of the carrier are not conductive in this configuration such that a plurality of the optoelectronic components can be arranged closely alongside one another without the risk of a short circuit. In particular, the carrier can be formed from an electrically insulating material such as, for example, a ceramic or an undoped semiconductor material.

In one configuration of the method of producing the optoelectronic component, provision is made of a carrier having a first connection region and a second connection region. Afterward, a radiation-emitting semiconductor chip is mounted onto the second connection region of the carrier. In a further step, a luminescence conversion layer is applied to the semiconductor chip. Furthermore, a lower housing part is applied to the carrier, the lower housing part adjoining the side flanks of the semiconductor chip. Afterward, an opening is produced in the luminescence conversion layer to expose a part of the surface of the semiconductor chip. A further opening, extending from the surface of the lower housing part as far as the first connection region on the carrier, is produced in the lower housing part.

The openings are filled with an electrically conductive material and an electrically conductive layer is subsequently applied, which connects the electrically conductive materials in the opening in the luminescence conversion layer and the opening in the lower housing part to one another. In this case, the electrically conductive layer is applied to a region of the luminescence conversion layer and a region of the surface of the lower housing part which therefore advantageously function as electrically insulating carriers of the electrically conductive layer. The surfaces of the luminescence conversion layer and of the lower housing part are preferably arranged at the same level and are adjacent to one another in a flush fashion. Advantageously, it is not necessary to apply an electrically insulating layer before the electrically conductive layer is applied. In this way, an electrical connection layer is produced which electrically conductively connects the semiconductor chip to the first electrical connection region on the surface of the carrier. Afterward, an upper housing part is applied to the lower housing part.

In this way, a contact-connection led through the housing formed from the lower housing part and the upper housing part to the carrier is produced in a particularly efficient manner. The optoelectronic component produced by the method is therefore distinguished by an advantageously low production outlay.

Preferably in the method, the lower housing part and/or the upper housing part are/is produced by dispensing, screen printing or compression molding.

Preferably, the luminescence conversion layer is adhesively bonded as a prefabricated lamina onto the semiconductor chip.

Further advantageous of the method are evident from the description of the optoelectronic component, and vice versa.

Our components and methods are explained in greater detail below on the basis of example in association with FIGS. 1 to 4.

Identical or identically acting constituent parts are provided with the same reference signs in each case in the figures. The illustrated constituent parts and the size relationships of the constituent parts among one another should not be regarded as true-to-scale.

The optoelectronic component schematically illustrated in cross section in FIG. 1 comprises a semiconductor chip 4 mounted onto a carrier 3 at its base surface 5. The semiconductor chip 4 has an active layer 24 from which electromagnetic radiation 16 is emitted. In particular, the semiconductor chip 4 can be an LED chip.

The active layer 24 of the radiation-emitting semiconductor chip 4 can be suitable, in particular, for emitting ultraviolet and/or blue radiation.

The semiconductor chip 4 is preferably based on a nitride compound semiconductor material. "Based on a nitride compound semiconductor" means that the semiconductor layer sequence or at least one layer thereof comprises a III nitride compound semiconductor material, preferably $In_xAl_yGa_{1-x-y}N$, wherein $0 \leq x \leq 1$, $0 \leq y \leq 1$ and $x+y \leq 1$. In this case, this material need not necessarily have a mathematically exact composition according to the above formula. Rather, it can comprise one or more dopants and additional constituent parts which substantially do not change the characteristic physical properties of the $In_xAl_yGa_{1-x-y}N$ material. For the sake of simplicity, however, the above formula only includes the essential constituent parts of the crystal lattice (In, Al, Ga, N), even if these can be replaced in part by small amounts of further substances.

At the radiation exit surface 6, the radiation-emitting semiconductor chip 4 preferably has a luminescence conversion layer 13. The luminescence conversion layer 13 contains one or more luminescence conversion substances by which at least part of the radiation emitted by the active zone 24 is converted toward a longer wavelength. The radiation 16 emitted by the optoelectronic component can therefore be, in particular, a mixed light composed of the radiation emitted by the active layer 24 and the converted radiation generated in the luminescence conversion layer 13. The radiation 16 emitted by the optoelectronic component can be white light, for example.

The luminescence conversion layer 13 can be, in particular, a prefabricated lamina, adhesively bonded, for example, onto the semiconductor layer sequence of the semiconductor chip 4. By way of example, the luminescence conversion layer 13 can comprise a polymer such as, for example, a silicone with an embedded luminescence conversion substance. In this case, the luminescence conversion layer can be produced by a compression molding method, for example. Preferably, the luminescence conversion layer 13 does not project beyond the semiconductor layer sequence of the semiconductor chip 4 in a lateral direction. The luminescence conversion layer 13 and the semiconductor layer sequence of the semiconductor chip 4 preferably have the same basic area, wherein the luminescence conversion layer 13 is preferably arranged flush on the semiconductor layer sequence of the semiconductor chip 4.

The semiconductor chip 4 is embedded into a housing 10 having a lower housing part 8 and an upper housing part 9. The lower housing part 8 advantageously directly adjoins side flanks 14 of the semiconductor chip 4. In particular, there is no interspace between the semiconductor chip 4 and the lower housing part 8. This is made possible, in particular, by virtue of the fact that electrical contact is not made with the semiconductor chip 4 using a bonding wire that would have to be led through from a radiation exit surface 6 of the semiconductor chip 4 between the housing and the semiconductor chip 4 to a connection region on the carrier. Instead, electrical contact is made by virtue of the fact than an electrical connection layer 7 is led from the radiation exit surface 6 of the semiconductor chip 4 via a part of the interface 19 between the lower housing part 8 and the upper housing part 9 and through the lower housing part 8 to a first connection region 1 on the carrier 3. The electrical connection layer 7 therefore leads at least partly through the housing 10, as a result of which a particularly compact optoelectronic component can be obtained.

A second electrical contact of the semiconductor chip 4 can be realized by virtue of the fact that the semiconductor chip 4 is mounted by its base surface 5 onto a second connection region 2 of the carrier 3. Alternatively, however, it would also be possible also to arrange the second electrical contact at the top side of the semiconductor chip 4 and connect the second contact to the second connection region 2 like the first contact by a further electrical connection layer led through the housing 10.

The first connection region 1 of the carrier is advantageously connected, by a first plated-through hole 11 running through the carrier 3, to a first rear-side contact 21 at the rear side of the carrier 3 opposite the radiation-emitting semiconductor chip 4. In a corresponding manner, the second connection region 2 connects to a second rear-side contact 22 by a second plated-through hole 12. At the rear-side contacts 21, 22, the optoelectronic component can be mounted onto a circuit board by a soldering connection, for example. The optoelectronic component is therefore advantageously surface-mountable.

The connection of the connection regions 1, 2 on that side of the carrier 3 which faces the semiconductor chip 4 to the rear-side contacts 21, 22 by the plated-through holes 11, 12 has the advantage that, in particular, no connection layers have to be led around the side flanks of the carrier 3. This advantageously contributes to the fact that the optoelectronic component can be realized very compactly.

The upper housing part 9 advantageously forms a reflector 15 for the radiation 16 emitted by the semiconductor chip 4. The reflector 15 preferably adjoins the radiation exit surface 6 of the semiconductor chip 4 at least in regions. The radiation exit surface 6 can be either the surface of the semiconductor layer sequence of the semiconductor chip 4 or, if a luminescence conversion layer 13 is arranged on the semiconductor chip 4, the surface of the luminescence conversion layer 13. By virtue of the fact that the reflector 15 directly adjoins the radiation exit surface 6 of the semiconductor chip 4, good beam shaping of the emitted radiation 16 is obtained.

Advantageously, the lower housing part 8 and the upper housing part 9 each contain particles 20 which increase the reflection of the housing material. The particles 20 can be $TiO_2$ particles, in particular. The proportion by weight of the particles 20 in the lower and/or upper housing part 8, 9 is preferably 5% to 50%. In the case of the lower housing part 8, a high reflection of the housing material is advantageous to reduce undesired coupling-out of radiation in a lateral direction. In the case of the upper housing part 9, a high reflection is advantageous since the upper housing part 9 forms a reflector 15 for the emitted radiation 16. In particular, it is possible to dispense with a reflection-increasing coating of the interfaces of the upper housing part 9 which form the reflector 15. The production outlay for the optoelectronic component is advantageously reduced in this way.

The lower housing part 8 and the upper housing part 9 preferably contain a basic material into which the reflection-increasing particles 20 are embedded. Preferably, the lower housing part 8 and the upper housing part 9 comprise the same basic material. In particular, the lower housing part 8 and the upper housing part 9 can in each case comprise a silicone. By virtue of the fact that the lower housing part 8 and the upper housing part 9 comprise the same basic material, in particular a good adhesion of the upper housing part 9 on the lower housing part 8 can be obtained.

Figure 2:
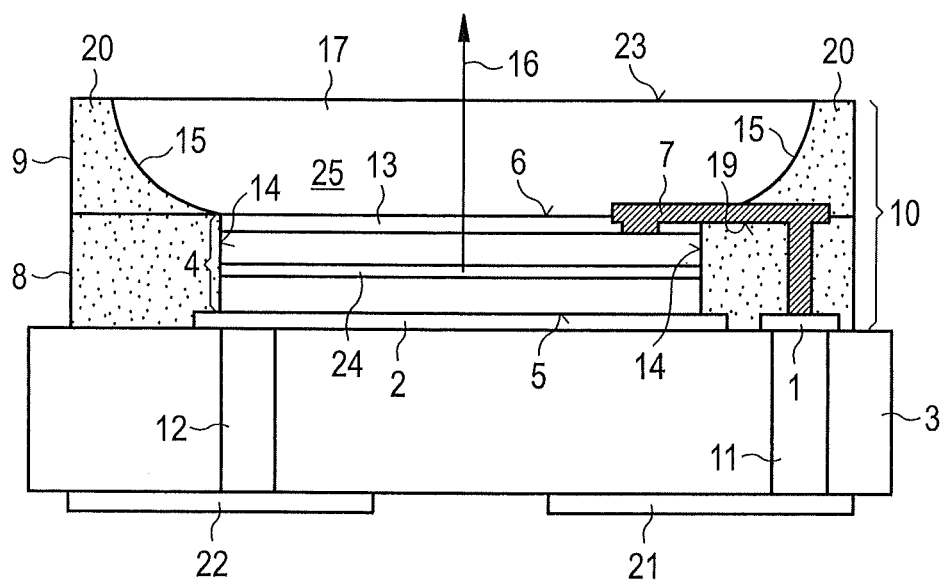
FIG. 2 shows a schematic illustration of a cross section through an optoelectronic component in accordance with a second example.

The second example of an optoelectronic component schematically illustrated in cross section in FIG. 2 differs from the optoelectronic component illustrated in FIG. 1 in that a cutout 25 in the upper housing part 9, through which cutout the reflector 15 is shaped, is filled with a transparent potting material 17. Preferably, the cutout 25 is filled with the transparent potting material 17 such that the potting material 17 is adjacent to the surface of the upper housing part 9 in a flush fashion such that the optoelectronic component has a planar surface 23. The transparent potting material 17 constitutes, in particular, protection of the semiconductor chip 4 against external influences such as, for example, moisture, contaminants or mechanical damage.

Otherwise, the example illustrated in FIG. 2 corresponds to the first example described above.

The third example of an optoelectronic component schematically illustrated in cross section in FIG. 3 differs from the optoelectronic component illustrated in FIG. 2 in that the transparent potting material 17 filled into the cutout 25 of the upper housing part 9 does not have a planar surface, but rather is shaped as a lens 18. This has the advantage that the potting material 17 not only protects the optoelectronic component against contaminants or mechanical damage, but simultaneously also functions as a beam-shaping element for the emitted radiation 16.

Otherwise, the example illustrated in FIG. 3 corresponds to the second example described above.

An example of a method of producing the optoelectronic component will be explained with reference to the following FIGS. 4A to 4E.

Figure 4A:
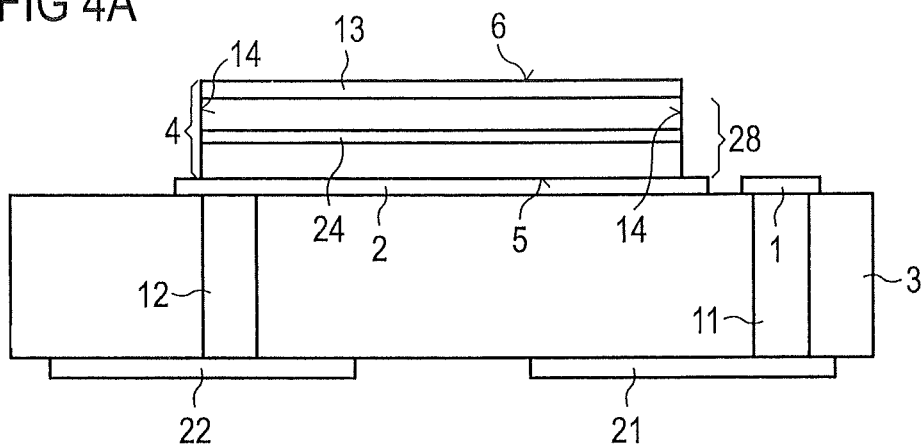
FIGS. 4A to 4E show a schematic illustration of an example of a method of producing an optoelectronic component on the basis of intermediate steps.

In the case of the intermediate step illustrated in FIG. 4A, provision has been made of a carrier 3 having a first connection region 1 and a second connection region 2. The connection regions 1, 2 respectively connect to rear-side contacts 21, 22 of the carrier 3 by a plated-through hole 11, 12. A radiation-emitting semiconductor chip 4 has been mounted onto the second connection region 2 of the carrier 3. By way of example, the semiconductor chip 4 can be soldered onto the second connection region 2 of the carrier 3 at its base surface 5.

The semiconductor chip 4 contains a semiconductor layer sequence 28 to which a luminescence conversion layer 13 is applied. The luminescence conversion layer 13 is preferably a prefabricated lamina which was adhesively bonded onto the semiconductor layer sequence 28 of the semiconductor chip 4.

Figure 4B:
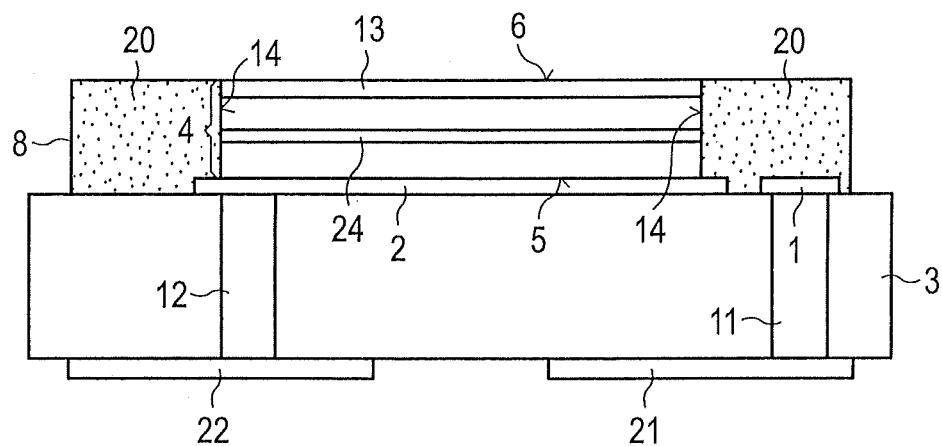

In the case of the intermediate step illustrated in FIG. 4B, a lower housing part 8 has been applied to the carrier 3, the lower housing part advantageously adjoining the side flanks 14 of the semiconductor chip 4 and preferably completely enclosing the semiconductor chip 4. The lower housing part 8 preferably contains a silicone into which reflection-increasing particles 20 composed preferably of $TiO_2$ are embedded. The lower housing part 8 can be produced, in particular, by dispensing, screen printing or compression molding.

Figure 4C:
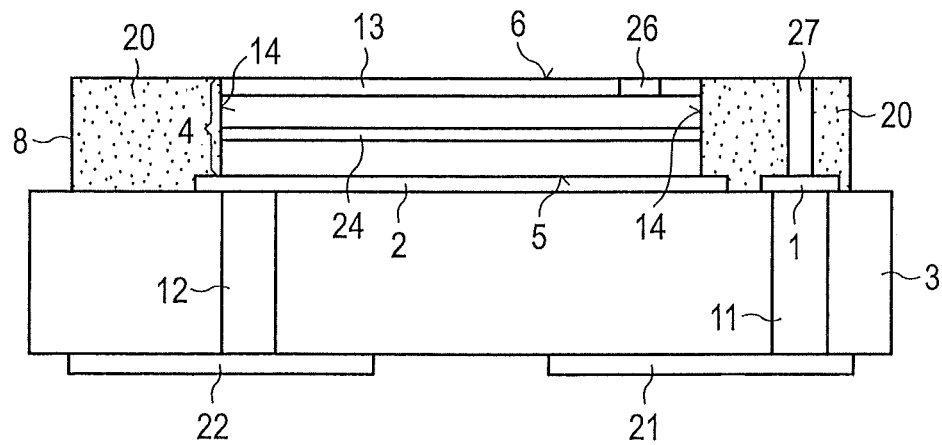

In the case of the intermediate step illustrated in FIG. 4C, an opening 26 was produced in the luminescence conversion layer 13. The opening 26 enables an electrical connection layer to contact the semiconductor layer sequence of the semiconductor chip 4. Furthermore, a further opening 27 has been produced in the lower housing part 8. The opening 27 extends from the surface of the lower housing part 8 through the lower housing part 8 as far as the first connection region 1 on the carrier 3.

Figure 4D:
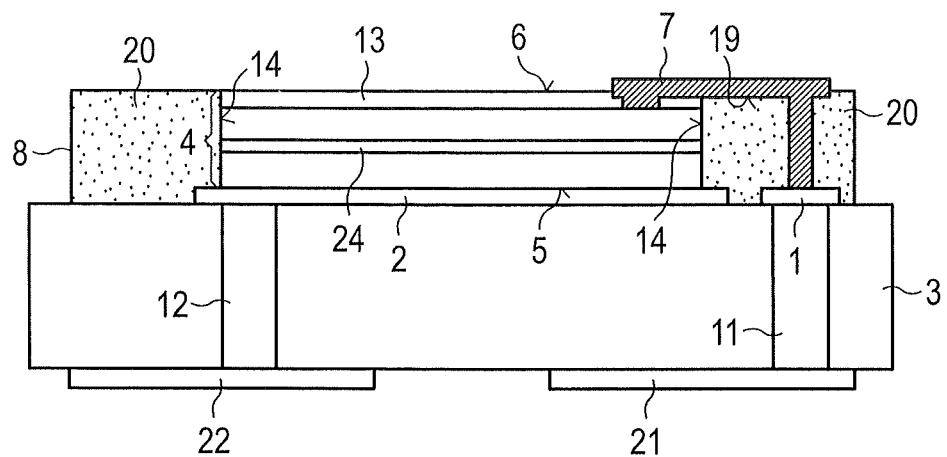

In the case of the intermediate step illustrated in FIG. 4D, the previously produced openings in the luminescence conversion layer 13 and the lower housing part 8 have in each case been filled with an electrically conductive material. Furthermore, an electrically conductive layer was applied to a partial region of the surface of the luminescence conversion layer 13 and of the surface of the lower housing part 8, the electrically conductive layer connecting the electrically conductive materials in the opening 26 of the luminescence conversion layer 13 and the opening 27 in the lower housing part 8 to one another. An electrical connection layer 7 which electrically connects the semiconductor chip 4 to the first electrical connection region 1 on the surface of the carrier 3 has been produced in this way.

Figure 4E:
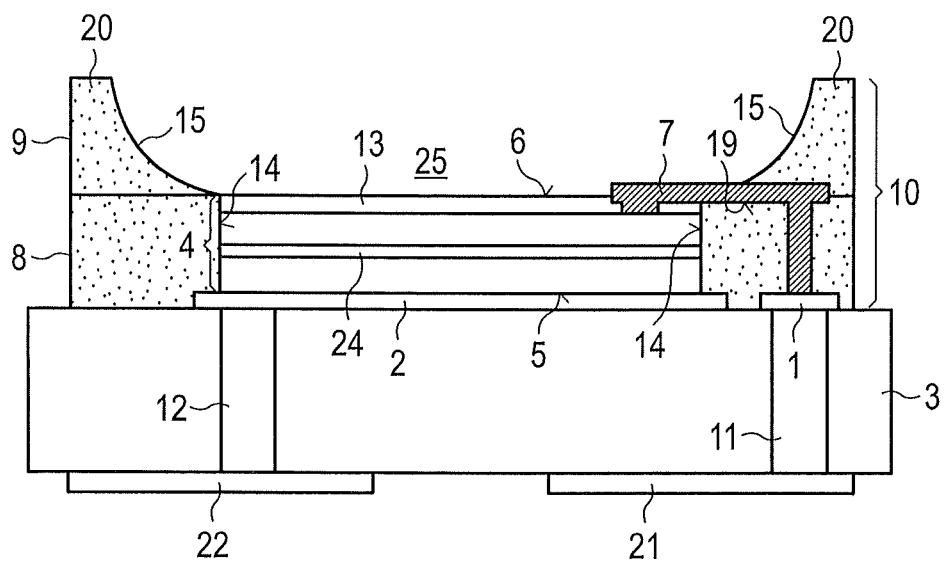

In the case of the intermediate step illustrated in FIG. 4E, an upper housing part 9 has been arranged on the lower housing part 8. The upper housing part 9 has a cutout 25, which, in the optoelectronic component, forms a reflector 15 for radiation emitted by the semiconductor chip 4. Like the lower hosing part 8, the upper housing part 9 can be produced, for example, by dispensing, screen printing or compression molding. The upper housing part 9 preferably contains the same material as the lower housing part 8, preferably a silicone, into which particles composed of $TiO_2$ are embedded. The lower housing part 8 and the upper housing part 9 together form a housing 10 for the semiconductor chip 4. The optoelectronic component produced in this way corresponds to the optoelectronic component illustrated in FIG. 1. Further advantageous configurations of the method are evident from the description of the examples of the optoelectronic component and vice versa.

In a further method step, the cutout 25 can be filled with a potting material 17 by dispensing, for example. The potting material 17 can be a planar potting material, as in the example illustrated in FIG. 2, or can be shaped as a lens 18 as illustrated in FIG. 3.

Our components and methods are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic component, comprising:
   a carrier having a first connection region and a second connection region,
   a radiation-emitting semiconductor chip having a base surface and a radiation exit surface opposite the base surface, wherein the semiconductor chip is arranged by the base surface on the carrier,
   a housing having a lower housing part arranged on the carrier and adjoining side flanks of the semiconductor chip, and an upper housing part arranged on the lower housing part and shaped as a reflector for radiation emitted by the semiconductor chip, and
   an electrical connection layer which leads from the radiation exit surface of the semiconductor chip via a part of the interface between the lower and the upper housing part and through the lower housing part to the first connection region on the carrier.

2. The optoelectronic component according to claim 1, wherein the semiconductor chip is mounted at the base surface onto the second connection region of the carrier.

3. The optoelectronic component according to claim 1, wherein the lower and/or the upper housing part comprise(s) a basic material into which are embedded particles that increase reflection of the basic material.

4. The optoelectronic component according to claim 3, wherein the particles are $TiO_2$ particles.

5. The optoelectronic component according to claim 3, wherein a proportion by weight of the particles in the lower and/or upper housing part is 5% to 50%.

6. The optoelectronic component according to claim 3, wherein the lower and the upper housing part comprise the same basic material.

7. The optoelectronic component according to claim 3, wherein the basic material is a silicone.

8. The optoelectronic component according to claim 1, wherein the reflector adjoins the radiation exit surface of the semiconductor chip at least in regions.

9. The optoelectronic component according to claim 1, wherein the semiconductor chip has a luminescence conversion layer at its radiation exit surface.

10. The optoelectronic component according to claim 9, wherein the luminescence conversion layer does not project beyond a semiconductor layer sequence of the semiconductor chip in a lateral direction.

11. The optoelectronic component according to claim 9, wherein a surface of the luminescence conversion layer is arranged at the same level as the interface between the lower and the upper housing part, and a part of the electrically conductive layer is arranged on a part of the surface of the luminescence conversion layer.

12. The optoelectronic component according to claim 1, wherein the carrier has a first electrical rear-side contact and a second electrical rear-side contact at a rear side facing away from the semiconductor chip,
   the first electrical rear-side contact electrically conductively connects to the first connection region by at least one first plated-through hole running through the carrier, and the second electrical rear-side contact electrically conductively connects to the second connection region by at least one second plated-through hole running through the carrier.

13. A method of producing an optoelectronic component, comprising:
   providing a carrier having a first connection region and a second connection region,
   mounting a radiation-emitting semiconductor chip onto the second connection region of the carrier,
   applying a luminescence conversion layer to the semiconductor chip,
   applying a lower housing part which adjoins the side flanks of the semiconductor chip to the carrier,
   producing an opening in the luminescence conversion layer (13),
   producing a further opening in the lower housing part, the further opening extending from the surface of the lower housing part as far as the first connection region on the carrier,
   filling the openings with an electrically conductive material,
   applying an electrically conductive layer which connects the electrically conductive materials in the opening in the luminescence conversion layer and the opening in the lower housing part to one another, and
   applying an upper housing part to the lower housing part.

14. The method according to claim 13, wherein the lower housing part and/or the upper housing part are/is produced by dispensing, screen printing or compression molding.

15. The method according to claim 13, wherein the luminescence conversion layer is adhesively bonded as a prefabricated lamina onto the semiconductor chip.

16. An optoelectronic component, comprising:
   a carrier having a first connection region and a second connection region,
   a radiation-emitting semiconductor chip having a base surface and a radiation exit surface, opposite the base surface, wherein the semiconductor chip is arranged by the base surface on the carrier,
   a housing having a lower housing part arranged on the carrier and adjoining side flanks of the semiconductor chip, and an upper housing part arranged on the lower housing part and shaped as a reflector for the radiation emitted by the semiconductor chip, and an electrical connection layer which leads from the radiation exit surface of the semiconductor chip via a part of the interface between the lower and the upper housing part and through the lower housing part to the first connection region on the carrier, wherein the lower and/or the upper housing part comprise(s) a basic material into which are embedded particles that increase reflection of the basic material, and the lower and the upper housing part comprise the same basic material.

* * * * *